(12) United States Patent
Schepis et al.

(10) Patent No.: US 11,776,808 B2
(45) Date of Patent: Oct. 3, 2023

(54) PLANARIZATION OF SPIN-ON FILMS

(71) Applicant: Tokyo Electron Limited, Tokyo (JP)

(72) Inventors: Anthony R. Schepis, Averill Park, NY (US); Anton deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 190 days.

(21) Appl. No.: 17/122,898

(22) Filed: Dec. 15, 2020

(65) Prior Publication Data
US 2021/0296121 A1 Sep. 23, 2021

Related U.S. Application Data

(60) Provisional application No. 62/990,823, filed on Mar. 17, 2020.

(51) Int. Cl.
*H01L 21/02* (2006.01)
*B05D 1/00* (2006.01)

(52) U.S. Cl.
CPC .. *H01L 21/02282* (2013.01); *H01L 21/02134* (2013.01); *B05D 1/005* (2013.01)

(58) Field of Classification Search
CPC ......... H01L 21/02282; H01L 21/02134; H01L 22/12; H01L 21/0274; H01L 21/31051; H01L 21/02118; H01L 21/02345; H01L 21/31058; B05D 1/005
See application file for complete search history.

(56) References Cited

U.S. PATENT DOCUMENTS

| 6,645,851 B1 | 11/2003 | Ho et al. | |
| 10,622,267 B2 * | 4/2020 | Burns | H01L 21/31055 |
| 11,455,436 B2 * | 9/2022 | Burns | G06F 30/10 |
| 2001/0006761 A1 | 7/2001 | Golz et al. | |

(Continued)

FOREIGN PATENT DOCUMENTS

KR 1019970030396 A 6/1997

OTHER PUBLICATIONS

Itani, Toshiro et al., "Resist Materials and Processes for Extreme Ultraviolet Lithography", Japanese Journal of Applied Physics, 52, 010002, Dec. 14, 2012, 15 pages.
Kooy, Nazrin et al., "A review of roll-to-roll nanoimprint lithography", Nanoscale Research Letters, SpringerOpen Journal, 9:320, Jun. 25, 2014, 13 pages.

(Continued)

*Primary Examiner* — Mohammed Shamsuzzaman
(74) *Attorney, Agent, or Firm* — Slater Matsil, LLP

(57) ABSTRACT

A method for planarizing a substrate includes: receiving a substrate having microfabricated structures that differ in height across the working surface of the substrate that define a non-planar topography, depositing a first layer that includes a solubility-shifting agent on the working surface of the substrate by spin-on deposition in a non-planar fashion, exposing the first layer to a first pattern of actinic radiation based on the topography, developing the first layer using a predetermined solvent, and depositing a second layer over the working surface of the substrate that has a greater planarity as compared to the first layer prior to developing the first layer. The first pattern of radiation changes a solubility of the first layer such that upper regions of the non-planar topography of the first layer are soluble to the predetermined solvent.

18 Claims, 4 Drawing Sheets

(56) References Cited

U.S. PATENT DOCUMENTS

| | | | | |
|---|---|---|---|---|
| 2005/0277064 | A1* | 12/2005 | Lamarre | G03F 7/0035 |
| | | | | 430/312 |
| 2007/0051697 | A1* | 3/2007 | DiPietro | G03F 7/0755 |
| | | | | 216/52 |
| 2007/0256301 | A1* | 11/2007 | Park | B41J 2/1639 |
| | | | | 29/890.1 |
| 2009/0008579 | A1* | 1/2009 | Takeya | B82Y 40/00 |
| | | | | 250/492.23 |
| 2012/0266810 | A1* | 10/2012 | Lan | H01L 21/31053 |
| | | | | 118/75 |
| 2016/0300726 | A1* | 10/2016 | deVilliers | G03F 7/40 |
| 2017/0148637 | A1* | 5/2017 | deVilliers | H01L 21/0337 |
| 2019/0393048 | A1* | 12/2019 | Sherpa | H01L 21/311 |
| 2020/0328102 | A1 | 10/2020 | Schepis et al. | |
| 2021/0294148 | A1* | 9/2021 | Grzeskowiak | G02F 1/133357 |
| 2022/0066317 | A1* | 3/2022 | Fulford | G03F 7/11 |

OTHER PUBLICATIONS

Pain, Laurent et al., "Direct write lithography: the global solution for R&D and manufacturing", Elsevier, ScienceDirect, C.R. Physique, vol. 7, Issue 8, Oct. 2006, pp. 910-923.

Watt, F., et al., "ION Beam Lithography and Nanofabrication: A Review", World Scientific, International Journal of Nanoscience, vol. 4, No. 3, Jun. 2005, 18 pages.

Zhang, Y., et al., "Direct-write techniques for maskless production of microelectroncis: a review of current state-of-the-art technologies", Loughborough University Institutional Repository, International Conference on Electronic Packaging Technology & High Density Packaging (ICEPT-HDP '09), ttp://dx.doi.org/10.1109/ICEPT.2009.5270702, Aug. 10-13, 2009, 9 pages.

Tokyo Electron Limited et al., "Notification of Transmittal of the International Search Report and the Written Opinion of the International Searching Authority, or the Declaration", PCT/US2021/017165, filed Feb. 9, 2021, dated May 31, 2021, 9 pages.

* cited by examiner

PLANARIZATION OF SPIN-ON FILMS

CROSS-REFERENCE TO RELATED APPLICATIONS

This application claims the benefit of U.S. Provisional Application No. 62/990,823, filed on Mar. 17, 2020, which application is hereby incorporated herein by reference.

TECHNICAL FIELD

This disclosure relates to semiconductor fabrication and related processes, including planarization of spin-on films.

BACKGROUND

Semiconductor processing involves forming many layers of materials over a semiconductor substrate. Some integration schemes may involve 70 or more levels to a design. Each level includes multiple process steps that involve the patterning of various films with differing geometries and aspect ratios. These patterning processes may result in non-planar topography that can impact the integrity of spin-on films used in standard semiconductor device processes.

Photoresist is a fundamental spin-on material used to pattern the majority of semiconductor layers employing lithography. It is important for a photoresist film to be applied uniformly to the wafer as changes in material thickness significantly hinder critical dimension resolution of a lithography process. Uniform application of photoresist films can be difficult, however, with topography. This is because the mechanics of the spin-on process cause varying thickness or coat defects as the resist interacts with features of varying heights/depths.

SUMMARY

In accordance with an embodiment of the invention, a method of forming a device includes receiving a substrate having microfabricated structures that differ in height relative to each other in a direction perpendicular to a working surface of the substrate such that the microfabricated structures define a non-planar topography across the working surface of the substrate; depositing a first layer on the working surface of the substrate by spin-on deposition, the first layer including a solubility-shifting agent, depositing the first layer resulting in a non-planar film; exposing the first layer to a first pattern of actinic radiation, the first pattern of actinic radiation based on a topography of the substrate, the first pattern of actinic radiation changing a solubility of the first layer such that upper regions of non-planar topography of the first layer are soluble to a predetermined solvent, and lower regions of non-planar topography of the first layer are insoluble to the predetermined solvent; developing the first layer using the predetermined solvent such that soluble portions of the first layer are removed; and depositing a second layer on the working surface of the substrate by spin-on deposition, where a top surface of the second layer has a greater planarity as compared to a top surface of the first layer prior to developing the first layer.

In accordance with another embodiment of the invention, a method of forming a device includes receiving a substrate having a non-planar surface in that the substrate has first surfaces and second surfaces, the first surfaces having a greater z-height as compared to the second surfaces; depositing a first layer on the working surface of the substrate by spin-on deposition, the first layer including a solubility-shifting agent, depositing the first layer resulting in a non-planar film in that the first layer covers both the first surfaces and the second surfaces; exposing the first layer to a first pattern of actinic radiation, the first pattern of actinic radiation based on coordinate locations of the first surfaces and the second surfaces, the first pattern of actinic radiation changing a solubility of the first layer such portions of the first layer that are on the first surfaces are soluble to a predetermined solvent, and portions of the first layer that are on the second surfaces are insoluble to the predetermined solvent; developing the first layer using the predetermined solvent such that soluble portions of the first layer are removed; and depositing a second layer on the working surface of the substrate by spin-on deposition, where a top surface of the second layer has a greater uniformity as compared to a top surface of the first layer prior to developing the first layer.

In accordance with another embodiment of the invention, a method of forming a device includes receiving a substrate including a first set of device features and a second set of device features formed across a major surface of the substrate, the first set of device features having a greater height than the second set of device features, where a height difference between the first set of device features and the second set of device features form a non-planar topography across the major surface of the substrate; spin-coating a first intervening layer over the substrate; exposing the substrate to a first localized pattern of radiation, where the first localized pattern of radiation is projected using direct write lithography; developing the first intervening layer to reduce the height difference between the first set of device features and the second set of device features; and measuring a topographic metric across the major surface of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of a semiconductor device during various stages of fabrication in accordance with an embodiment of the present application, wherein FIG. 1A illustrates a semiconductor device having a non-planar topography, FIG. 1B illustrates the device after depositing a first intervening layer and exposing the first intervening layer to a pattern of radiation, FIG. 1C illustrates the device after developing the first intervening layer, and FIG. 1D illustrates the device after coating the material with a second material;

FIGS. 3A-3B illustrate cross-sectional view of a semiconductor device during various stages of fabrication according to an embodiment of the present application, wherein FIG. 3A illustrates a semiconductor device after exposing a second intervening layer to a pattern of radiation, and FIG. 3B illustrates the device after developing the second intervening layer.

DETAILED DESCRIPTION OF ILLUSTRATIVE EMBODIMENTS

The advent of the Internet of Things (IoT) has caused a resurgence in processing of unique designs and device integrations from smart sensors to biotech to MEMS. Many of these devices have large topographic geometries inherent to their design at the micrometer scale.

Given topographies directly influences processing of semiconductor devices, specifically spin-on films. One such film is photoresist, a fundamental spin-on material used to pattern the majority of semiconductor layers employing lithography. During a photoresist coat process, interaction with topography can create thickness variations across the wafer. These thickness variations may create problems for subsequent steps in a semiconductor fabrication process. For example, lithographic imaging is generally used as part of a process to pattern surfaces of a semiconductor device during fabrication. An example of a lithographic process includes depositing photoresist on a substrate, partially exposing the photoresist to light through a patterned etch mask, developing the exposed photoresist to define the mask pattern in the photoresist, and then etching the photoresist to form the pattern in the substrate.

It is important for a photoresist film to be applied uniformly to the substrate as changes in material thickness significantly hinder critical dimension resolution of a lithography process. The critical dimension resolution of a pattern of features depends on the height variability of the film thickness of the photoresist. Lithography exposure systems are sensitive to focus changes. As the thickness of the photoresist changes across the surface of the substrate, so does the integrity of the subsequent pattern of features being resolved. Thus, a non-planar layer of the photoresist can induce variability in the critical dimension, thickness, profiles and/or roughness of a pattern of features being imaged. It is typically important for the definition of a pattern of device features to be uniform as their dimensionality impacts device performance/yield.

Embodiments of this disclosure describe a method for planarizing a non-planar surface across a substrate for subsequent lithographic patterning.

Embodiments of this disclosure include improved techniques for planarizing a film deposited over a substrate having a varied topography. Embodiments of this disclosure include applying intervening layers across a substrate and selectable exposing of the intervening layers to improve the planarity of a substrate.

Figure 1A:
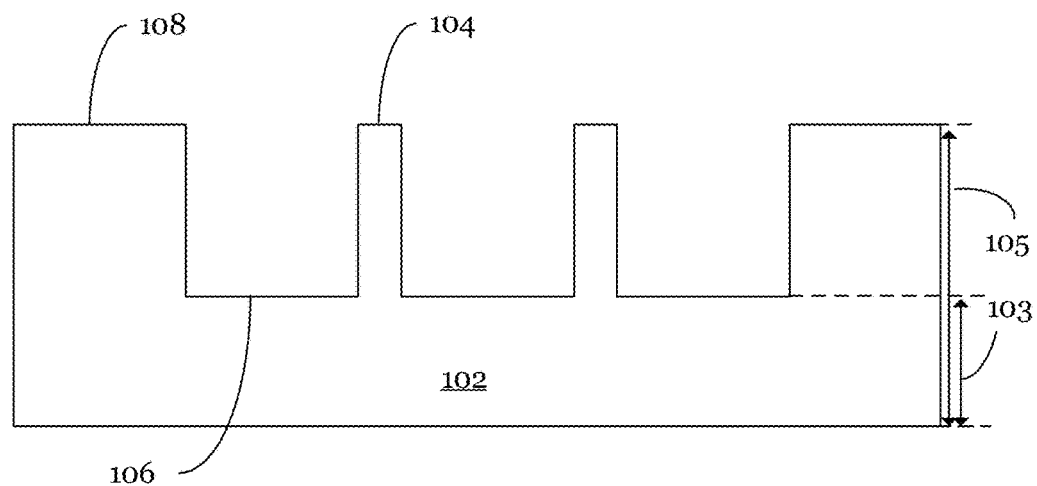
Figure 1B:
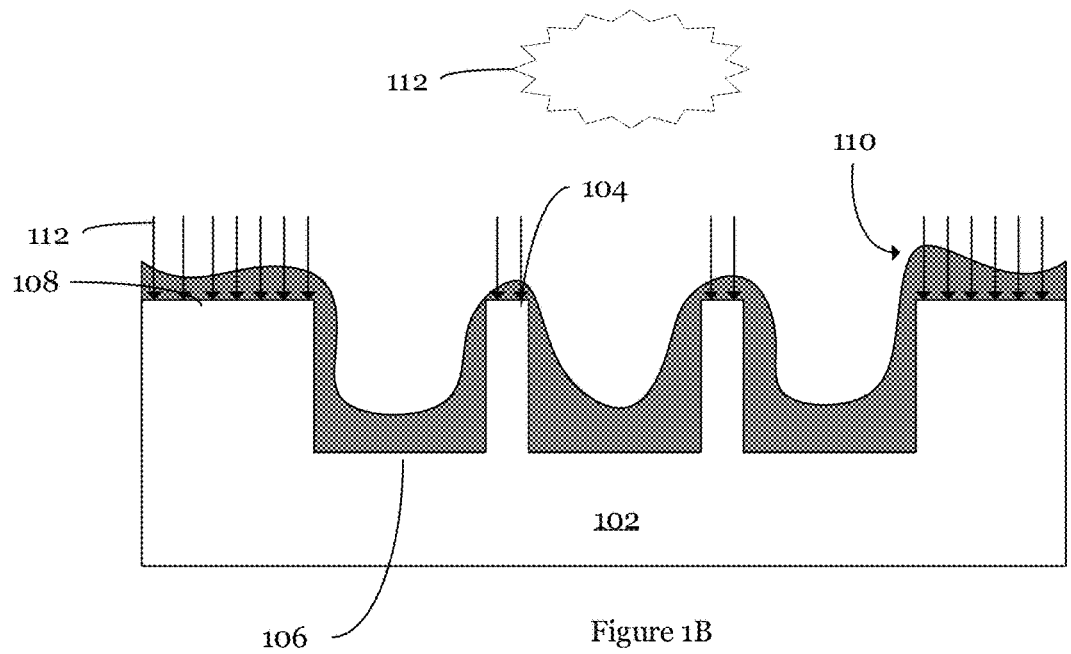
Figure 1C:
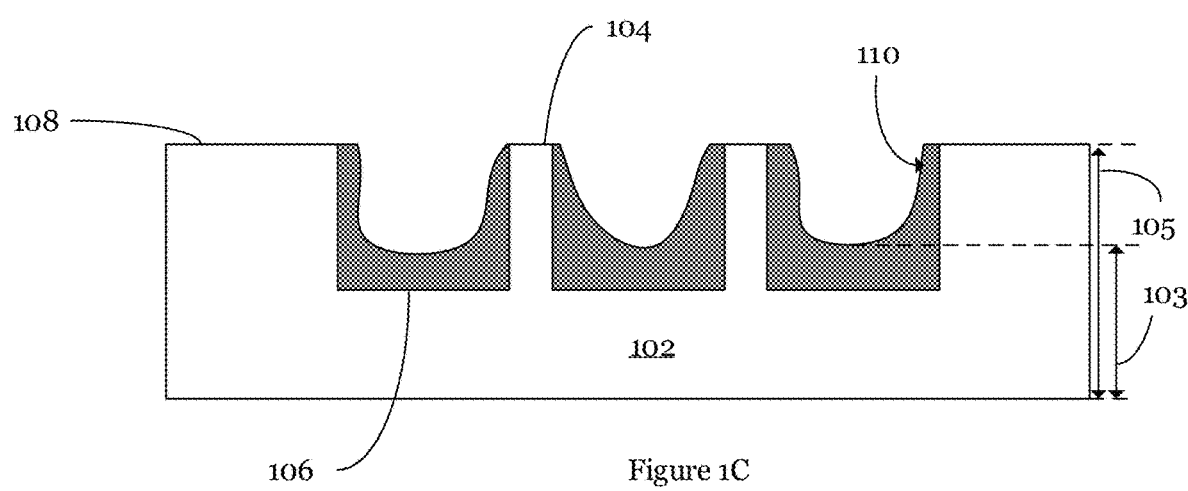
Figure 1D:
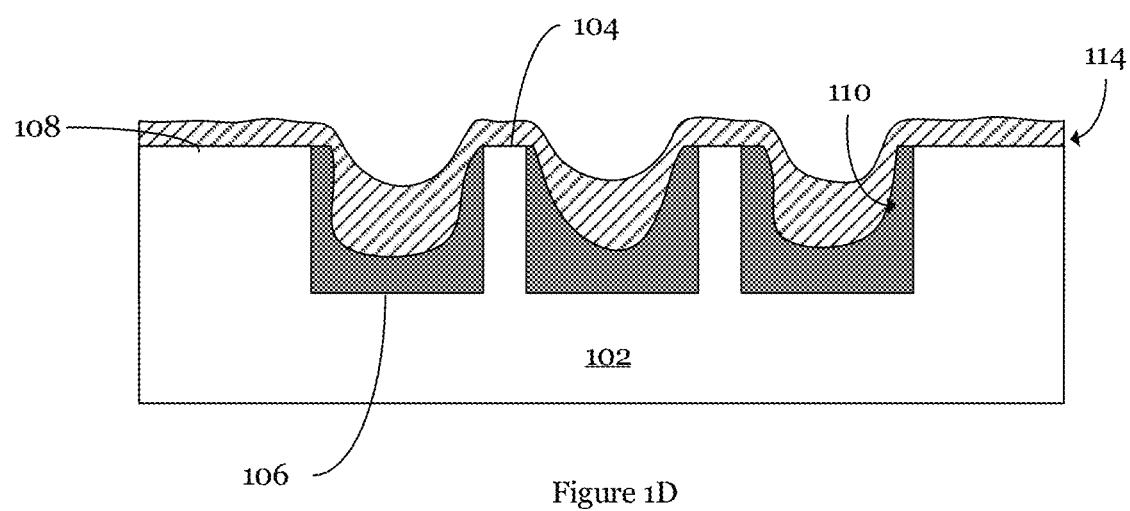

FIGS. 1A-1D illustrate cross-sectional views of a semiconductor device during various stages of fabrication in accordance with an embodiment of the present application, wherein FIG. 1A illustrates a semiconductor device having a non-planar topography, FIG. 1B illustrates the device after depositing a first intervening layer and exposing the first intervening layer to a pattern of radiation, FIG. 1C illustrates the device after developing the first intervening layer, and FIG. 1D illustrates the device after coating the material with a second material.

Referring to FIG. 1A, a semiconductor device 100 has a non-planar topography that includes microfabricated structures. In one or more embodiments, the microfabricated structures may include structures 104 that define recesses 106 and top surfaces 108 across a working surface of a substrate 102. Although this disclosure describes "recesses" it will be appreciated that other suitable features might be formed in a semiconductor layer, including lines, holes, open areas, trenches, vias, and/or other suitable structures. Structures 104 and recesses 106 may be formed using conventional lithography processes.

Substrate 102 generically refers to a workpiece being processed in accordance with embodiments of the invention. The substrate 102 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 102 is not limited to any particular base structure, underlying layer or overlying layer, patterned or un-patterned, but rather, is contemplated to include any such layer or base structure, and any combination of layers and/or base structures.

The substrate 102 may be a bulk substrate such as a bulk silicon substrate, a silicon on insulator substrate, or various other semiconductor substrates including a germanium substrate, a silicon carbide substrate, a gallium nitride (GaN) substrate including GaN on silicon, a gallium arsenide substrate, and others.

In one or more embodiments, the microfabricated structures differ in height relative to each other. For example, in one or more embodiments, the recesses have a first height 103 and the structures 104 and top surfaces 108 have a second height 105 in the z-direction. In one or more embodiments, the height difference of microfabricated structures relative to each other may be between 10 nm and 100 nm, e.g., greater than 50 nm. In other embodiments, the height difference may be greater than 5 microns especially in case of a deep opening/trench. The height (or depth) of each of the microfabricated structures may be measured using, scanning electron microscopy (SEM), small angle x-ray scattering (SAXS), or wafer optical scatterometry.

FIG. 1B illustrates a cross-sectional view of the semiconductor device after a first intervening layer 110 is deposited across the working surface of the substrate 102 using spin-on deposition. The first intervening layer 110 may comprise a photosensitive material such as a positive, negative, or a hybrid toned photoresist. In one example, the first intervening layer 110 comprises phenol formaldehyde resin or a diazo-naphthoquinone based resin. In one or more embodiments, the first intervening layer 110 may comprise a chemically amplified resist. In another embodiment, the first intervening layer 110 comprises a non-chemically amplified resist material such as PolyMethyl MethAcrylate (PMMA) or Hydrogene SilsesQuioxance (HSQ).

With spin-on deposition or spin coating, a particular material (e.g. the first intervening layer 110) is deposited on the substrate 102. The substrate is then rotated at a relatively high velocity, e.g., 2000 to 8000 rpm, so that centrifugal force causes the deposited material to move towards the edges of the substrate 102, thereby coating the substrate 102. Excess material is spun off the substrate 102. The thickness of the photoresist is determined by, amongst other factors, the resist viscosity and rotational speed of the substrate while spinning.

After the spin-on deposition, the photoresist is baked to form the first intervening layer 110. For example, a soft bake process may be used to evaporate the residual solvent of the photoresist and to densify the photoresist. The soft bake process includes heating the photo resist within a narrow temperature range, e.g., between 75° C. and 100° C.

When a substrate 102 includes a non-planar topography of densely packed microfabricated structures, this density can push the deposited material upward and manipulate a mass fraction of how much material fills in the recesses 106. In other words, the deposited material interacts with the non-planar surface of the substrate 102 (e.g., the differing heights between the microfabricated structures). This causes the deposited material to be deposited with a varying film thickness (e.g., varying z-heights across the substrate).

Referring to FIG. 1B, the first intervening layer 110 is deposited using a spin-on deposition process resulting in a varying film thickness across the non-planar surface of the substrate 102. In one or more embodiments, the first intervening layer 110 may be deposited with a thicker film thickness in the recesses 106 and a thinner film thickness on the structures 104 and the top surfaces 108 (or vice versa). The topography of the first intervening layer 110 is merely an example, and that actual changes in topography may vary from deposition to deposition, even with a substrate having a similar topography of substrate 102.

Advantageously, in one or more embodiments, prior to forming microfabricated structures, the first intervening layer 110 is exposed to a localized radiation pattern to improve the planarization of the working surface of the substrate 102.

Referring again to FIG. 1B, the first intervening layer 110 undergoes exposure to a localized pattern of radiation 112. Prior to the exposure to radiation 112, the substrate 102 is aligned with the tool exposing the substrate 102 to the radiation. In various embodiments, the alignment may depend on the stack that is being patterned. For example, in one embodiment, metallic materials in the back end of the line may be used to align the tool. In another embodiment, optical alignment with an alignment mark may be used. In another embodiment, the topography of the first intervening layer 110 may be used to align the substrate 102.

After aligning the substrate 102 with the tool, the topography of the first intervening layer 110 is measured. The topography of the first intervening layer may be measured using a measuring tool such as an atomic force microscopy (AFM), a profilometer, or an optical thickness metrology tool.

Then based on the topography and tone of the first intervening layer 110, the exposure pattern of the pattern of radiation 112 is determined. Because the expected topography is determined by the layout, the exposure pattern can be predetermined in some embodiments. In one or more embodiments, pattern of radiation 112 is localized such that the portions of the first intervening layer 110 covering the higher/taller microfabricated structures (e.g. the structures 104 and top surfaces 108) are removed and the portions of the first intervening layer 110 filling the recesses 106 remain after a subsequent development step.

In one or more embodiments, the pattern of radiation 112 may comprise actinic radiation such as ultraviolet radiation projected using a mask-less lithography tool, such as a direct write lithography tool. In one or more embodiments, direct write lithography methods such as digital light projection (DLP), grating light valve lithography, electron beam lithography, plasmonic lithography, focused ion beam (FIB) lithography or nanoimprinting may be used to form the exposure pattern of the pattern of radiation 112. For example, the pattern of radiation 112 may comprise an actinic radiation having a wavelength between 365 nm and 405 nm and may be formed and projected using a direct write lithography process in a dedicated direct writing machine. The direct write lithography process uses computer controlled optics to project an exposure pattern of radiation instead of using a traditional mask. Traditionally, to expose a substrate to a pattern of radiation requires: designing a mask using computer aided design (CAD) software, building the mask, and exposing the substrate through the mask. However, because direct write lithography utilizes computer controlled optics to project radiation, the computer controlled optics are able to form a pattern of radiation directly from the CAD file.

In one or more embodiments, during high volume manufacturing, the first intervening layer 110 deposited on identical substrates may have different topographies. Therefore, to planarize identical substrates, individual patterns of radiation have to be formed. Advantageously, as described above, direct write lithography is a mask-less radiation that allows for the pattern of radiation 112 to be programmed digitally. One advantage of this is that, individual masks do not have to be built for every exposure of the first intervening layer 110, saving process time and fabrication costs.

Referring back to FIG. 1B, in one or more embodiments where the first intervening layer 110 is a positive photoresist, the pattern of radiation 112 is localized over the structures 104 and the top surfaces 108. In this manner, the portions of the first intervening layer 110 covering the structures 104 and the top surfaces 108 become soluble to a solvent, such as developer fluid, while portions of the first intervening layer 110 filling the recesses 106 remain insoluble to the solvent.

In one or more embodiments where the first intervening layer 110 is a negative photoresist, the pattern of radiation 112 is localized over the recesses 106. In this manner the portions of the first intervening layer 110 covering the recesses become insoluble to a solvent while the portions of the first intervening layer 110 cover the structures 104 and the top surfaces 108 are soluble in the solvent.

After exposure to the actinic radiation, a hard bake process may be performed to stabilize and harden the photoresist. The hard bake process may be performed at a higher temperature than the soft bake process and, for example, performed between 100° C. and 150° C.

FIG. 1C illustrates the semiconductor device after portions of the first intervening layer 110 are removed.

Referring to FIG. 1C, a developing step is then executed to remove the soluble portions of the first intervening layer 110 deposited over the structures 104 and the top surfaces 108. In one or more embodiments, the first intervening layer 110 may be removed by exposing to a developer solution, which may comprise phenol-based strippers, acetone, trichloroethylene, and others when the first intervening layer 110 is a positive resist. In one or more embodiments, the first intervening layer 110 may be removed by exposing to a developer solution, which may comprise methyl ethyl ketone, methyl isobutyl ketone, and others when the first intervening layer 110 is a negative resist.

Advantageously, in one or more embodiments, the portions of the first intervening layer 110 remain within the recesses 106. One advantage of this is the remaining portions of the first intervening layer 110 decreases the relative height difference between the recesses 106 and the structures 104 and the top surfaces 108 (i.e. the first height 103 increases due to the first intervening layer). Therefore, the difference between the first height 103 and the second height 105 is reduced, resulting in an improved topography.

In various embodiments, after the developing step, a topographic metric of the substrate may be measured. The topographic metric may include, for example, the planarity or uniformity of the first intervening layer 110. The topographic metric may be measured using an optical metrology technique. For example, the thickness of the intervening layer 110 may be measured at different locations or the height of the top surface of the intervening layer 110 may be measured relative to a horizontal plane at different locations. The statistical distribution may be then used to obtain a measure of the planarity or uniformity of the intervening layer 110. Other less often used metrics for measuring topography may also include surface techniques, for example, measuring surface roughness of the substrate 102.

In one or more embodiments, the topographic metric may be compared to a target topographic metric. In one embodiment, if the measured topographic metric meets the topographic metric, a subsequent pattern of microstructures may be formed on the substrate using a conventional lithography process. In other embodiments, if the topographic metric does not meet a target topographic metric, the process discussed above may be repeated until a target topographic metric is met.

Referring to FIG. 1D, a second material 114 is deposited onto the substrate using spin-on deposition. As illustrated in FIG. 1D, the second material 114 is deposited in a more planar fashion than the deposition of the first intervening layer 110. The composition of the second material 114 depends on whether the target topography metric was met in the previous step. In one or more embodiments where the target topography metric was met, the second material 114 may comprise a photoresist used in a lithography process to form a subsequent pattern of microfabricated structures. In one or more embodiments, where the target topography metric was not met, the second material 114 may be a second intervening layer comprising the same material as the first intervening layer 110 intended to further planarize the working surface of the substrate 102.

Figure 2:
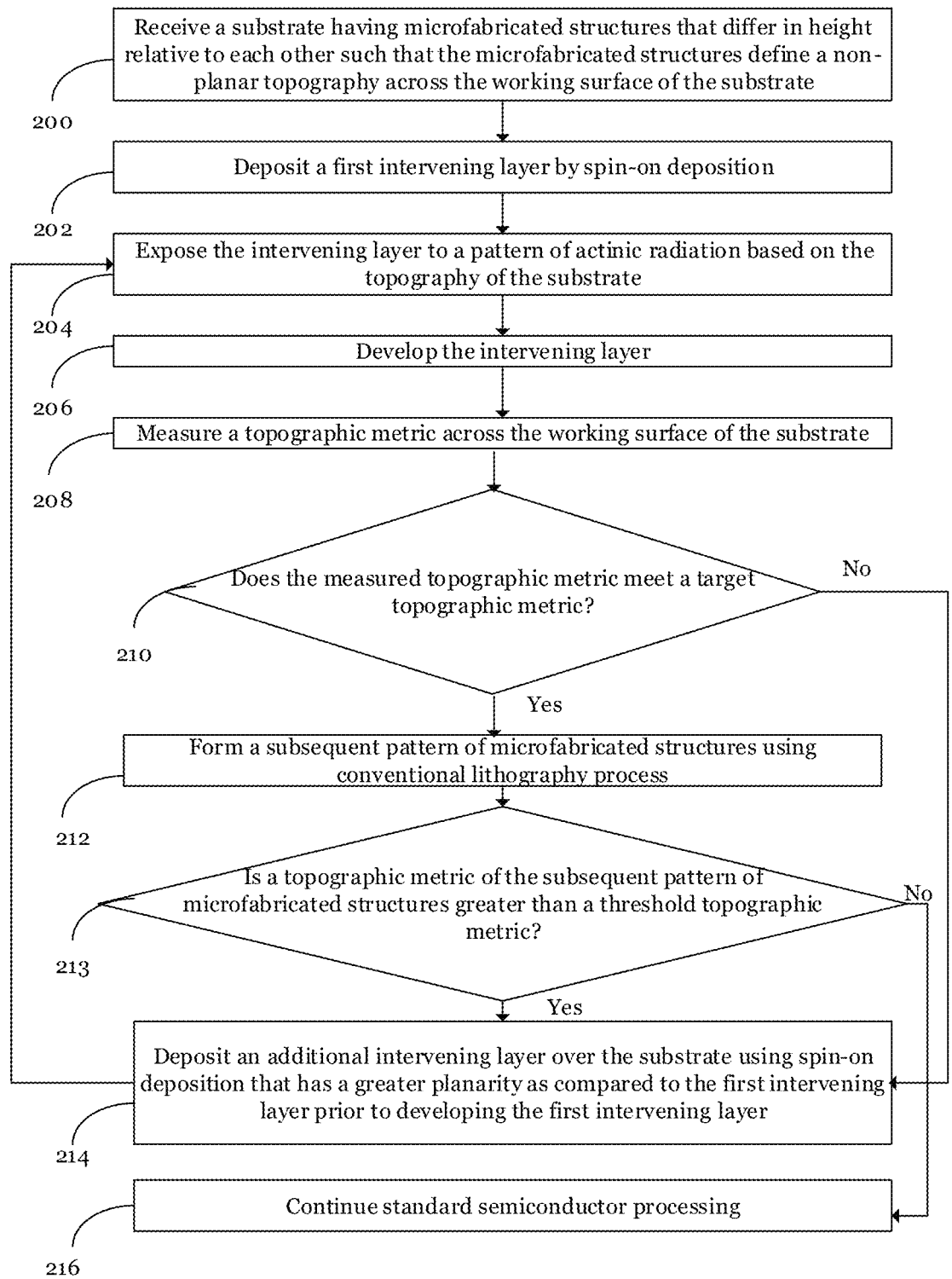
FIG. 2 is a flow chart of a method for planarizing the working surface of a substrate according to an embodiment of the present invention.

FIG. 2 is a flow chart illustrating an example process flow used to planarize a working surface of a substrate in accordance with an embodiment of the present invention.

As illustrated in block 200 and described with reference to FIG. 1A, a substrate 102 having microfabricated structures that differ in height relative to each other are formed across a working surface of a substrate 102. The difference in height between the microfabricated structures defines a non-planar topography across the working surface of the substrate 102.

As next illustrated in block 202 and described with reference to FIG. 1B, a first intervening layer 110 is deposited across the substrate using spin-on deposition. As next illustrated in block 204 and described with reference to FIG. 1B, the first intervening layer 110 is exposed to a pattern of radiation 112.

As next illustrated in block 206, and described with reference to FIG. 1C, the first intervening layer is developed to remove the portions of the first intervening layer 110 deposited over the structures 104 and the top surfaces 108.

Advantageously, as described above, removing the portions of the first intervening layer 110 deposited over the higher surfaces while the portions of the first intervening layer 110 remain in the recesses reduces the relative heights between the microfabricated structures. One advantage of this is that it improves the planarity of the working surface of the substrate 102.

As next illustrated in block 208, and described with reference to FIG. 1C, a topographic metric across the working surface of the substrate 102 is measured. As next illustrated in block 210, the measured topographic metric is compared to a target topographic metric. In various embodiments, the target topographic metric may be a surface height relative to a horizontal plane as measured with an optical technique or an electron microscopy technique. In one or more embodiments, the surface height may be defined based on the tolerance levels of the process equipment being used, for example, the depth of focus of the lithography imaging tool. In one or more embodiments, a standard deviation of the surface height of the top surface may be compared with a target standard deviation and topologies outside the target standard deviation may be marked as not meeting the topographic metric. In other embodiments, the target topographic measurement may be defined as the uniformity of the first intervening layer 110. The planarity or uniformity of the first intervening layer 110 may be measured using an optical metrology technique. If the measured topographic metric meets a target topographic metric, the method proceeds to block 212 and a subsequent pattern of microstructures may be formed on the substrate 102 using a conventional lithography process.

If the measured topographic metric does not meet the target topographic metric the method proceeds to block 214.

As next illustrated in block 213, after forming a subsequent pattern of microfabricated devices, a topographic metric of the subsequent pattern of microfabricated devices is compared to a threshold topographic metric. In response to determining that the topographic metric of the subsequent pattern of microfabricated devices is greater than a threshold topographic metric the process proceeds to block 214.

In contrast, in response to determining that the topographic metric is less than or equal to the threshold topographic metric the process proceeds to block 216 and standard semiconductor device processing is continued.

As next illustrated in block 214 and described with reference to FIG. 1D, if the target topographic metric does not meet the measured topography metric, an additional intervening layer is deposited over the substrate using spin-on deposition. In one or more embodiments the additional intervening layer may comprise the same material as the first intervening layer 110. After depositing the additional intervening layer, the method repeats blocks 204-212 until the target topographic metric is met.

Figure 3A:
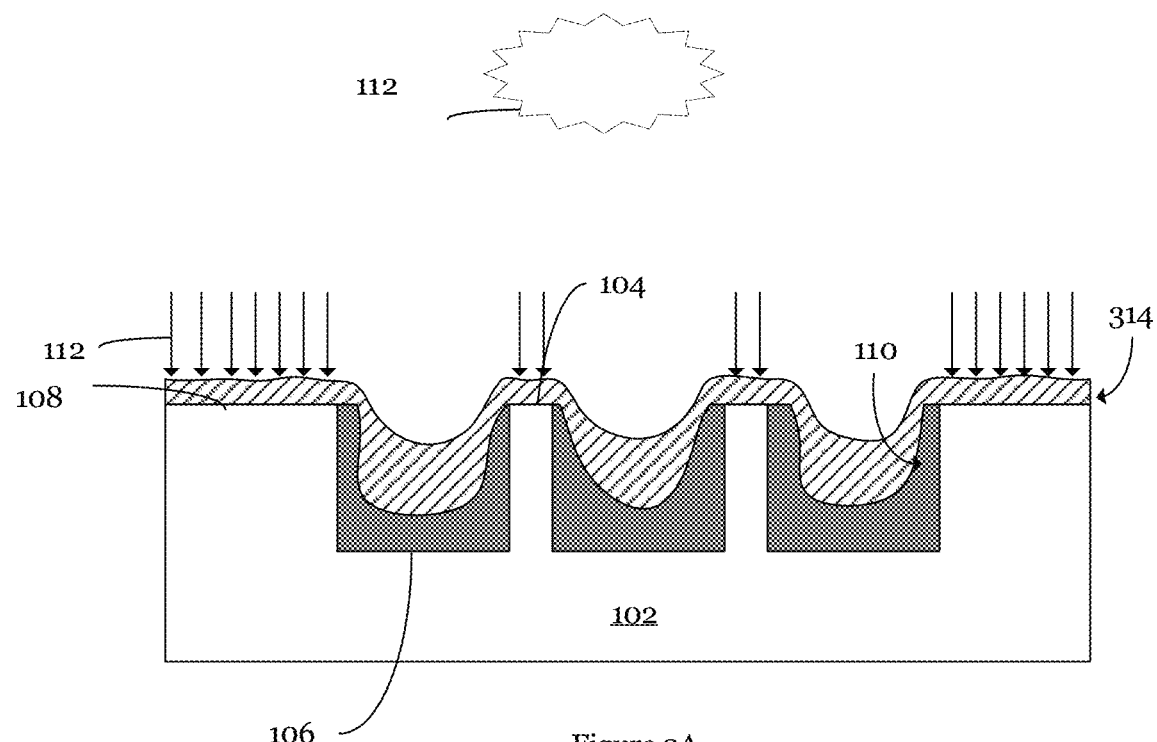
Figure 3B:
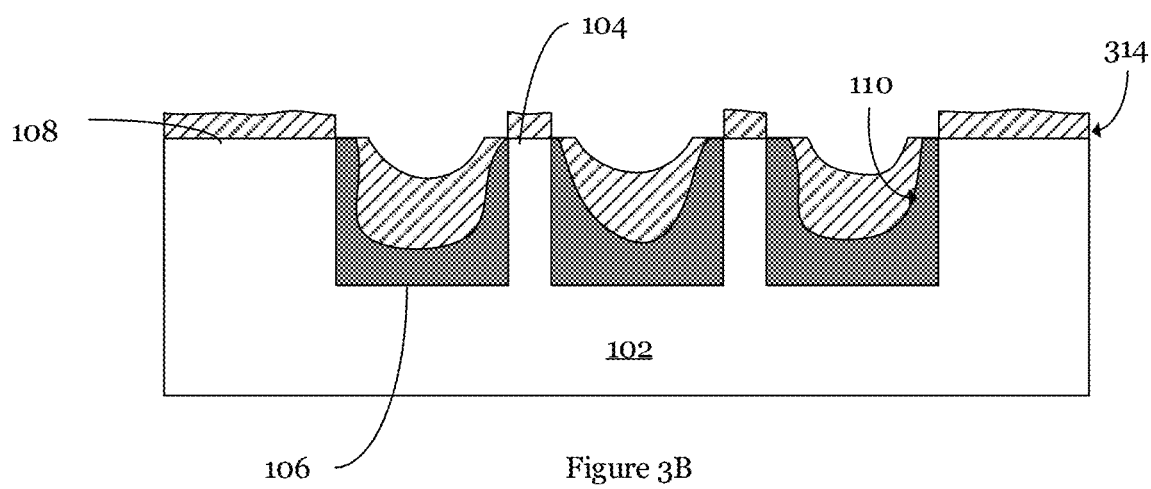

FIGS. 3A-3B illustrate an example of further planarizing the substrate if the measured topographic metric does not meet the target topographic metric. Accordingly, FIGS. 3A-3C continues from FIGS. 1A-1D.

FIGS. 3A-3B illustrate cross-sectional view of a semiconductor device during various stages of fabrication according to an embodiment of the present application, where FIG. 3A illustrates a semiconductor device after exposing a second intervening layer to a pattern of radiation, and FIG. 3B illustrates the device after developing the second intervening layer.

Referring to FIG. 3A, a second intervening layer 314 is deposited over the substrate using spin on deposition and is exposed to a pattern of radiation 112. As illustrated in FIG. 3A, the second intervening layer 314 is deposited with an improved planarity compared to when the first intervening layer 110 was deposited due to the decrease in the relative height difference between the microstructures. In one or more embodiments, the second intervening layer 314 may comprise the same material as the first intervening layer 110. The pattern of radiation may comprise the same material and may be formed in the same manner described in FIG. 1B.

Referring to FIG. 3B, the second intervening layer 314 undergoes a development step to remove the portions of the second intervening layer 314 covering the structures 104 and the top surfaces 108. The development step may comprise the same material and may be performed in the same manner described in FIG. 1C.

As illustrated in FIG. 3B, for the reasons described above, the relative height difference between the recesses 106 and the structures 104 and the top surfaces 108 is further reduced by the second intervening layer 314. This results in the substrate 102 having a further improved planarization.

Example embodiments of the invention are summarized here. Other embodiments can also be understood from the entirety of the specification as well as the claims filed herein.

Example 1. A method of planarizing a substrate, the method including: receiving a substrate having microfabricated structures that differ in height relative to each other in a direction perpendicular to a working surface of the substrate such that the microfabricated structures define a non-planar topography across the working surface of the substrate; depositing a first layer on the working surface of the substrate by spin-on deposition, the first layer including a solubility-shifting agent, depositing the first layer resulting in a non-planar film; exposing the first layer to a first pattern of actinic radiation, the first pattern of actinic radiation based on a topography of the substrate, the first pattern of actinic radiation changing a solubility of the first layer such that upper regions of non-planar topography of the first layer are soluble to a predetermined solvent, and lower regions of non-planar topography of the first layer are insoluble to the predetermined solvent; developing the first layer using the predetermined solvent such that soluble portions of the first layer are removed; and depositing a second layer on the working surface of the substrate by spin-on deposition, where a top surface of the second layer has a greater planarity as compared to a top surface of the first layer prior to developing the first layer.

Example 2. The method of example 1, where the first pattern of actinic radiation is projected using a direct-write system.

Example 3. The method of one of examples 1 or 2, where the microfabricated structures have relative height differences greater than five microns.

Example 4. The method of one of examples 1 to 3, where the microfabricated structures have relative height differences greater than 50 nanometers.

Example 5. The method of one of examples 1 to 4, further including: where the second layer includes the solubility-shifting component; exposing the second layer to the first pattern of actinic radiation, the first pattern of actinic radiation changing a solubility of the second layer such that upper regions of the second layer are soluble to a predetermined solvent, and lower regions of the second layer are insoluble to the predetermined solvent; and developing the second layer using the predetermined solvent such that soluble portions of the first layer are removed.

Example 6. A method of planarizing a substrate, the method including: receiving a substrate having a non-planar surface in that the substrate has first surfaces and second surfaces, the first surfaces having a greater z-height as compared to the second surfaces; depositing a first layer on the working surface of the substrate by spin-on deposition, the first layer including a solubility-shifting agent, depositing the first layer resulting in a non-planar film in that the first layer covers both the first surfaces and the second surfaces; exposing the first layer to a first pattern of actinic radiation, the first pattern of actinic radiation based on coordinate locations of the first surfaces and the second surfaces, the first pattern of actinic radiation changing a solubility of the first layer such portions of the first layer that are on the first surfaces are soluble to a predetermined solvent, and portions of the first layer that are on the second surfaces are insoluble to the predetermined solvent; developing the first layer using the predetermined solvent such that soluble portions of the first layer are removed; and depositing a second layer on the working surface of the substrate by spin-on deposition, where a top surface of the second layer has a greater uniformity as compared to a top surface of the first layer prior to developing the first layer.

Example 7. The method of example 6 where the first pattern of actinic radiation is projected using a direct-write system.

Example 8. The method of one of examples 6 or 7 further including: exposing the second layer to the first pattern of actinic radiation, the first pattern of actinic radiation based on coordinate locations of the first surfaces and the second surfaces, the first pattern of actinic radiation changing a solubility of the second layer such that portions of the second layer that are on the first surfaces are soluble to the predetermined solvent, and portions of the second layer that are on the second surfaces are insoluble to the predetermined solvent; and developing the second layer using the predetermined solvent such that soluble portions of the second layer are removed.

Example 9. The method of one of examples 6 to 8, where the first surfaces have a z-height greater than at least 5 microns compared to the second surfaces.

Example 10. The method of one of examples 6 to 9, where the first surfaces have a z-height greater than at least 50 nm compared to the second surfaces.

Example 11. The method of one of examples 6 to 10, where the first pattern of actinic radiation has a wavelength between 193 nm and 405 nm.

Example 12. A method for forming a device, the method including: receiving a substrate including a first set of device features and a second set of device features formed across a major surface of the substrate, the first set of device features having a greater height than the second set of device features, where a height difference between the first set of device features and the second set of device features form a non-planar topography across the major surface of the substrate; spin-coating a first intervening layer over the substrate; exposing the substrate to a first localized pattern of radiation, where the first localized pattern of radiation is projected using direct write lithography; developing the first intervening layer to reduce the height difference between the first set of device features and the second set of device features; and measuring a topographic metric across the major surface of the substrate.

Example 13. The method of example 12 further including: comparing the topographic metric to a target topographic metric; in response to determining the topographic metric meets the target topographic metric, forming a subsequent pattern of device features using a conventional lithography process.

Example 14. The method of one of examples 12 or 13 further including: comparing the topographic metric to a target topographic metric; and in response to determining the topographic metric is different from a target topographic metric, spin-coating a second intervening layer over the substrate, exposing the substrate to the localized pattern of radiation, and developing the second intervening layer to further reduce the height difference between the first set of device features and the second set of device features.

Example 15. The method of one of examples 12 to 14, where the first intervening layer includes a positive tone photoresist and the localized pattern of radiation is formed over the first set of device features.

Example 16. The method of one of examples 12 to 15, where the first intervening layer includes a negative tone photoresist and the localized pattern of radiation is formed over the second set of device features.

Example 17. The method of one of examples 12 to 16, where the first radiation includes of actinic radiation.

Example 18. The method of one of examples 12 to 17, where the first radiation has a wavelength between 193 nm and 405 nm.

Example 19. The method of one of examples 12 to 18, where the height difference between the first set of device features and the second set of device features is greater than five microns.

Example 20. The method of one of examples 12 to 19, where the height difference between the first set of device features and the second set of device features is greater than 50 nm.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of planarizing a substrate, the method comprising:
    receiving a substrate having a non-planar working surface;
    depositing a first layer on the non-planar working surface of the substrate by spin-on deposition, the first layer including a solubility-shifting agent, the first layer having a non-planar topography;
    exposing the first layer to a first pattern of actinic radiation, the first pattern of actinic radiation based on the non-planar topography of the first layer, the first pattern of actinic radiation selectively changing a solubility of the first layer such that upper regions of the non-planar topography of the first layer are soluble to a predetermined solvent, and lower regions of the non-planar topography of the first layer are insoluble to the predetermined solvent;
    developing the first layer using the predetermined solvent such that soluble portions of the first layer are removed, the developing resulting in a wet-processed top surface of the substrate; and
    depositing a second layer on the wet-processed top surface of the substrate by spin-on deposition, wherein a top surface of the second layer has a greater planarity as compared to a top surface of the first layer prior to developing the first layer;
    wherein the second layer includes the solubility-shifting agent;
    exposing the second layer to the first pattern of actinic radiation, the first pattern of actinic radiation changing a solubility of the second layer such that upper regions of the second layer are soluble to a predetermined solvent, and lower regions of the second layer are insoluble to the predetermined solvent; and
    developing the second layer using the predetermined solvent such that soluble portions of the first layer are removed.

2. The method of claim 1, wherein the first pattern of actinic radiation is projected using a direct-write system.

3. The method of claim 1, wherein the non-planar working surface of the substrate comprises microfabricated structures that have relative height differences greater than five microns.

4. A method of planarizing a substrate, the method comprising:
    receiving a substrate having a non-planar surface in that the non-planar surface comprises first surfaces and second surfaces, the first surfaces having a greater z-height as compared to the second surfaces;
    depositing a first layer on the non-planar surface of the substrate by spin-on deposition, the first layer including a solubility-shifting agent, depositing the first layer resulting in a non-planar film in that the first layer covers both the first surfaces and the second surfaces;
    using a direct-write system, exposing the first layer to a first pattern of actinic radiation without a mask, the first pattern of actinic radiation being digitally programmed and based on coordinate locations of the first surfaces and the second surfaces, the first pattern of actinic radiation changing a solubility of the first layer such portions of the first layer that are on the first surfaces are soluble to a predetermined solvent, and portions of the first layer that are on the second surfaces are insoluble to the predetermined solvent;
    developing the first layer using the predetermined solvent such that soluble portions of the first layer are removed, the developing resulting in a wet-processed top surface of the substrate; and
    depositing a second layer on the wet-processed top surface of the substrate by spin-on deposition, wherein a top surface of the second layer has a greater uniformity as compared to a top surface of the first layer prior to developing the first layer;
    exposing the second layer to the first pattern of actinic radiation, the first pattern of actinic radiation based on coordinate locations of the first surfaces and the second surfaces, the first pattern of actinic radiation changing a solubility of the second layer such that portions of the second layer that are on the first surfaces are soluble to the predetermined solvent, and portions of the second layer that are on the second surfaces are insoluble to the predetermined solvent; and
    developing the second layer using the predetermined solvent such that soluble portions of the second layer are removed.

5. The method of claim 4, wherein the first surfaces have a z-height greater than at least 5 microns compared to the second surfaces.

6. The method of claim 4, wherein the first pattern of actinic radiation has a wavelength between 193 nm and 405 nm.

7. A method for forming a device, the method comprising:
receiving a substrate having a non-planar topography across a major surface of the substrate, the non-planar topography comprising a height difference between a first area of the substrate and a second area of the substrate, the first area having a greater height than the second area;
spin-coating a first intervening layer over the substrate;
exposing the substrate to a first localized pattern of radiation, wherein the first localized pattern of radiation is projected using direct write lithography;
developing the first intervening layer to reduce the height difference using a wet process, the developing resulting in a wet-processed top surface of the substrate;
measuring a topographic metric across the major surface of the substrate; and
comparing the topographic metric to a target topographic metric; and
in response to determining the topographic metric is different from a target topographic metric, spin-coating a second intervening layer on the wet-processed top surface of the substrate, exposing the substrate to the first localized pattern of radiation using direct write lithography, and developing the second intervening layer to further reduce the height difference.

8. The method of claim 7 further comprising
in response to determining the topographic metric meets the target topographic metric, forming a subsequent pattern of device features using a conventional lithography process.

9. The method of claim 7, wherein the first intervening layer comprises a positive tone photoresist and the first localized pattern of radiation is formed over the first area.

10. The method of claim 7, wherein the first intervening layer comprises a negative tone photoresist and the first localized pattern of radiation is formed over the second area.

11. The method of claim 7, wherein the first localized pattern of radiation comprises of actinic radiation.

12. The method of claim 7, wherein the first localized pattern of radiation has a wavelength between 193 nm and 405 nm.

13. The method of claim 7, wherein the height difference between the first set of device features and the second set of device features is greater than five microns.

14. The method of claim 7 further comprising after forming the subsequent pattern of device features, measuring an updated topographic metric across the major surface of the substrate.

15. The method of claim 14 further comprising:
comparing the updated topographic metric to another target topographic metric; and
in response to determining the updated topographic metric meets the another target topographic metric, forming another subsequent pattern of device features.

16. The method of claim 14 further comprising:
comparing the updated topographic metric to another target topographic metric; and
in response to determining the updated topographic metric is different from the another target topographic metric, spin-coating another intervening layer over the substrate, exposing the substrate to the first localized pattern of radiation, and developing the another intervening layer.

17. The method of claim 1, wherein the first pattern of actinic radiation is programmed digitally and projected without a mask.

18. The method of claim 1, wherein the first pattern of actinic radiation has a wavelength between 365 nm and 405 nm.

* * * * *